(12) United States Patent
Yoshiyuki

(10) Patent No.: US 8,080,917 B2
(45) Date of Patent: Dec. 20, 2011

(54) DRIVING APPARATUS, HOLDING APPARATUS, EXPOSURE APPARATUS, AND DEVICE FABRICATION METHOD

(75) Inventor: Koji Yoshiyuki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 207 days.

(21) Appl. No.: 12/100,044

(22) Filed: Apr. 9, 2008

(65) Prior Publication Data
US 2009/0001851 A1    Jan. 1, 2009

(30) Foreign Application Priority Data

Apr. 20, 2007    (JP) ................................ 2007-112292

(51) Int. Cl.
*H01L 41/09* (2006.01)
(52) U.S. Cl. ........................................ 310/317; 310/311
(58) Field of Classification Search ................. 310/317, 310/311
See application file for complete search history.

(56) References Cited

U.S. PATENT DOCUMENTS

| | | | |
|---|---|---|---|
| 5,479,062 A * | 12/1995 | Yoshino | 310/316.03 |
| 6,647,764 B1 * | 11/2003 | Paul et al. | 73/54.41 |
| 7,176,609 B2 | 2/2007 | Takeuchi et al. | |
| 7,336,026 B2 | 2/2008 | Takeuchi et al. | |
| 7,379,037 B2 | 5/2008 | Takeuchi et al. | |
| 7,474,060 B2 | 1/2009 | Takeuchi et al. | |
| 7,528,539 B2 | 5/2009 | Ohwada et al. | |
| 2001/0032058 A1 * | 10/2001 | Rueger et al. | 702/107 |
| 2004/0140857 A1 * | 7/2004 | Ogiso | 331/107 A |
| 2004/0189548 A1 | 9/2004 | Takeuchi et al. | |
| 2004/0256995 A1 | 12/2004 | Takeuchi et al. | |
| 2005/0073232 A1 | 4/2005 | Takeuchi et al. | |
| 2005/0073234 A1 | 4/2005 | Takeuchi et al. | |
| 2005/0073235 A1 | 4/2005 | Takeuchi et al. | |
| 2005/0073790 A1 | 4/2005 | Takeuchi et al. | |
| 2005/0116603 A1 | 6/2005 | Takeuchi et al. | |
| 2005/0280346 A1 | 12/2005 | Takeuchi et al. | |
| 2006/0012937 A1 * | 1/2006 | Watanabe et al. | 361/160 |
| 2006/0175929 A1 * | 8/2006 | Sawada et al. | 310/312 |
| 2007/0029896 A1 * | 2/2007 | Ha et al. | 310/317 |
| 2007/0200455 A1 * | 8/2007 | Yamaguchi | 310/318 |
| 2008/0238249 A1 * | 10/2008 | Takahashi et al. | 310/317 |

FOREIGN PATENT DOCUMENTS

| | | |
|---|---|---|
| EP | 1 463 021 A2 | 9/2004 |
| JP | 5-152635 A | 6/1993 |
| JP | 2004-310059 A | 11/2004 |
| JP | 2005-175271 | 6/2005 |
| KR | 10-0653673 B1 | 12/2006 |

OTHER PUBLICATIONS

Korean Office Action dated Feb. 2, 2010, issued in corresponding Korean patent application No. 10-2008-0035870.

* cited by examiner

*Primary Examiner* — Thomas M Dougherty
*Assistant Examiner* — Bryan P Gordon
(74) *Attorney, Agent, or Firm* — Fitzpatrick, Cella, Harper & Scinto

(57) ABSTRACT

A driving apparatus, which drives an object, includes a plurality of piezoelectric elements configured to drive a plurality of portions of the object, a plurality of voltage apply units configured to apply voltages to the plurality of piezoelectric elements, and a control unit configured to control the plurality of voltage apply units so that differences among the voltages applied to the plurality of piezoelectric elements do not exceed a predetermined value.

7 Claims, 7 Drawing Sheets

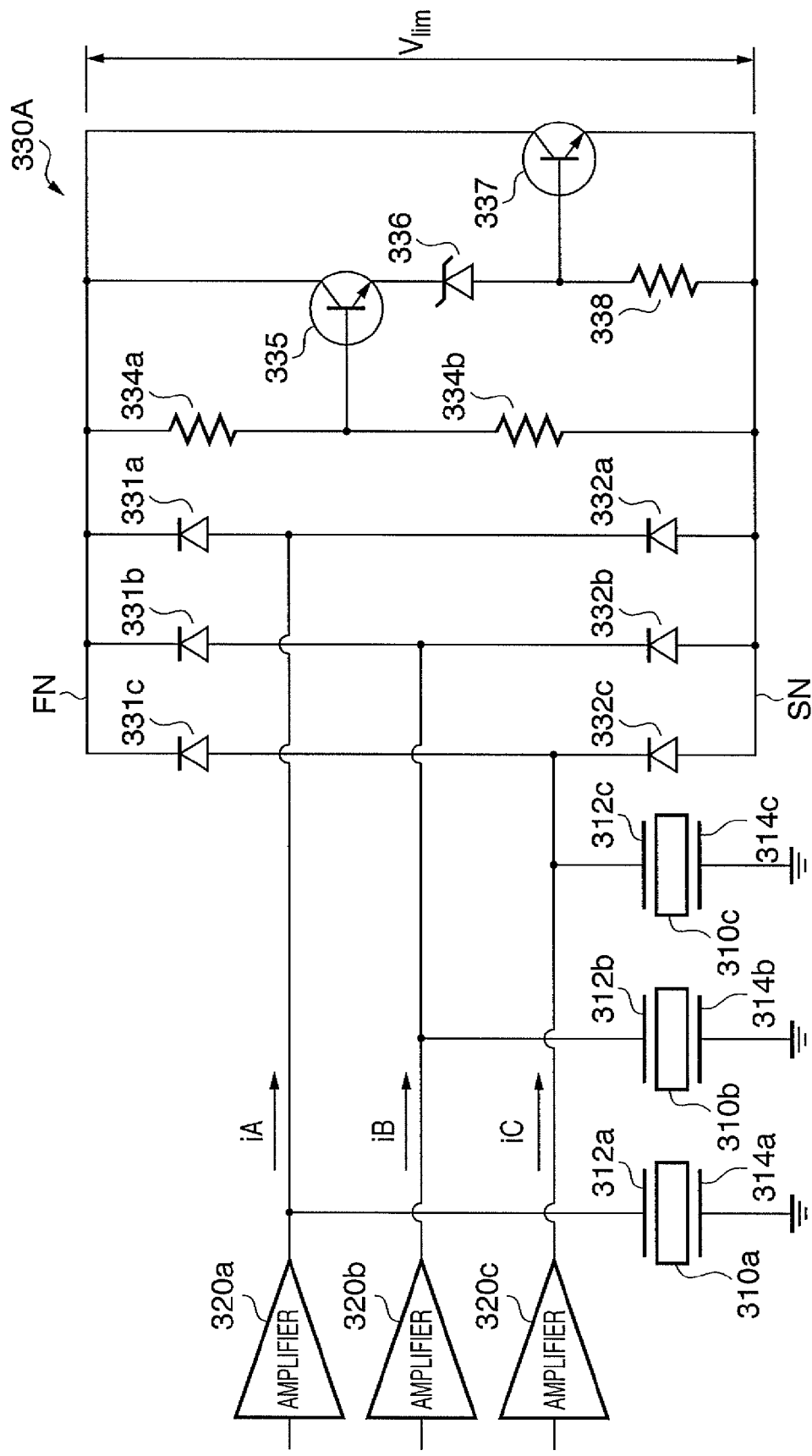
F I G. 4

DRIVING APPARATUS, HOLDING APPARATUS, EXPOSURE APPARATUS, AND DEVICE FABRICATION METHOD

This application claims the benefit of Japanese Application No. 2007-112292, filed on Apr. 20, 2007, which is hereby incorporated by reference herein in its entirety.

BACKGROUND OF THE INVENTION

1. Field of the Invention

The present invention relates to a driving apparatus, a holding apparatus, an exposure apparatus, and a device fabrication method.

2. Description of the Related Art

An exposure apparatus has conventionally been employed to fabricate a micropatterned semiconductor device, such as a semiconductor memory or a logic circuit using photolithography. The exposure apparatus transfers various types of patterns (circuit patterns) formed on reticles (originals) onto, for example, silicon wafers (substrates).

Along with a recent increase in the degree of integration of semiconductor devices, it is becoming a common practice to transfer patterns finer than ever onto wafers. An exposure apparatus is, therefore, required to have a projection optical system, which is less likely to suffer from wavefront aberration or distortion (i.e., which has an excellent resolving power). To fabricate large-scaled integrated semiconductor devices, it is demanded not only to improve the resolving power of a projection optical system, but also, to improve the overlay accuracy (the accuracy of overlaying several patterns onto a wafer), as an important factor.

To meet this demand, it is necessary to build optical elements, such as lenses, in a projection optical system, while they are precisely positioned (their optical designs are satisfied). It is also necessary to adjust the positions of the optical elements in the projection optical system upon fluctuation (e.g., the influence of an atmospheric pressure variation or heat generated upon exposure) of an exposure apparatus used. In stacking frame bodies that hold the optical elements on each other in the projection optical system, the positions of the frame bodies are adjusted to position the optical elements. This optical element positioning requires close attention to the positional adjustment of the frame bodies, which requires close scrutiny and a great deal of effort.

Under the circumstances, Japanese Patent Laid-Open No. 2005-175271 proposes a driving mechanism (adjusting mechanism), which can easily perform the positioning and position adjustment of an optical element in a projection optical system with high accuracy. Such driving mechanisms are equidistantly arranged at three points on the circumference of an optical element, and can drive the optical element in the vertical direction (Z direction) and inclination directions ($\theta x$ direction and $\theta y$ direction) using rectilinear actuators, such as stacked piezoelectric elements. Basically, as shown in FIG. 7, displacement sensors CD for measuring displacements of an optical element OE extend in the Z direction. The position of the optical element OE in three directions (Z direction, $\theta x$ direction, and $\theta y$ direction) can be controlled by feeding back the measurement results obtained by the displacement sensors CD to rectilinear actuators DA. FIG. 7 is a block diagram schematically showing the positioning control of an optical element by a conventional driving mechanism.

In recent years, it is also demanded to develop a driving mechanism, which can perform the positioning and position adjustment of an optical element in the Z direction, with a longer stroke and higher accuracy.

Unfortunately, as the stroke of an optical element in the Z direction increases, the conventional driving mechanism inevitably drives it in the $\theta x$ direction and $\theta y$ direction in larger amounts. This may excessively incline (tilt) the optical element. As a consequence, the stress of an adhesive bonding the optical element and the cell exceeds a limit. Then, the optical element peels off from the cell (or the optical element is damaged), or plastically deforms as a force produced beyond the stress limit acts on the cell.

The tilt of an optical element can be limited (controlled) using a displacement sensor. However, if the displacement sensor fails, it becomes impossible to limit the tilt of the optical element.

SUMMARY OF THE INVENTION

The present invention provides a driving apparatus that drives an object, such as an optical element, in the vertical direction (Z direction) and inclination directions ($\theta x$ direction and $\theta y$ direction), while limiting the driving amounts of the object in its inclination directions, so as to prevent any damage and deformation of the object.

According to one aspect, the present invention provides a driving apparatus, which drives an object, comprising a plurality of piezoelectric elements configured to drive a plurality of portions of the object, a plurality of voltage applying units configured to apply voltages to the plurality of piezoelectric elements, and a control unit configured to control the plurality of voltage applying units, so that differences among the voltages applied to the plurality of piezoelectric elements do not exceed a predetermined value.

According to another aspect of the present invention, a holding apparatus comprises a holding unit configured to hold an optical element, and a driving apparatus configured to drive the optical element held by the holding unit, and the driving apparatus includes a plurality of piezoelectric elements configured to drive a plurality of portions of the optical element, a plurality of voltage applying units configured to apply voltages to the plurality of piezoelectric elements, and a control unit configured to control the plurality of voltage applying units, so that differences among the voltages applied to the plurality of piezoelectric elements do not exceed a predetermined value.

According to still another aspect, the present invention provides an exposure apparatus comprising the above holding apparatus, and an optical system configured to transfer a pattern of a reticle onto a substrate by exposure via an optical element held by the holding apparatus.

According to yet another aspect, the present invention provides a device fabrication method comprising steps of exposing a substrate using the exposure apparatus discussed above, and performing a development process for the substrate exposed.

Further features of the present invention will become apparent from the following description of exemplary embodiments, with reference to the attached drawings.

BRIEF DESCRIPTION OF THE DRAWINGS

FIG. 4 is a schematic circuit diagram showing the arrangement of a driving unit corresponding to the second embodiment in the holding apparatus shown in FIG. 1.

DESCRIPTION OF THE EMBODIMENTS

Figure 1:
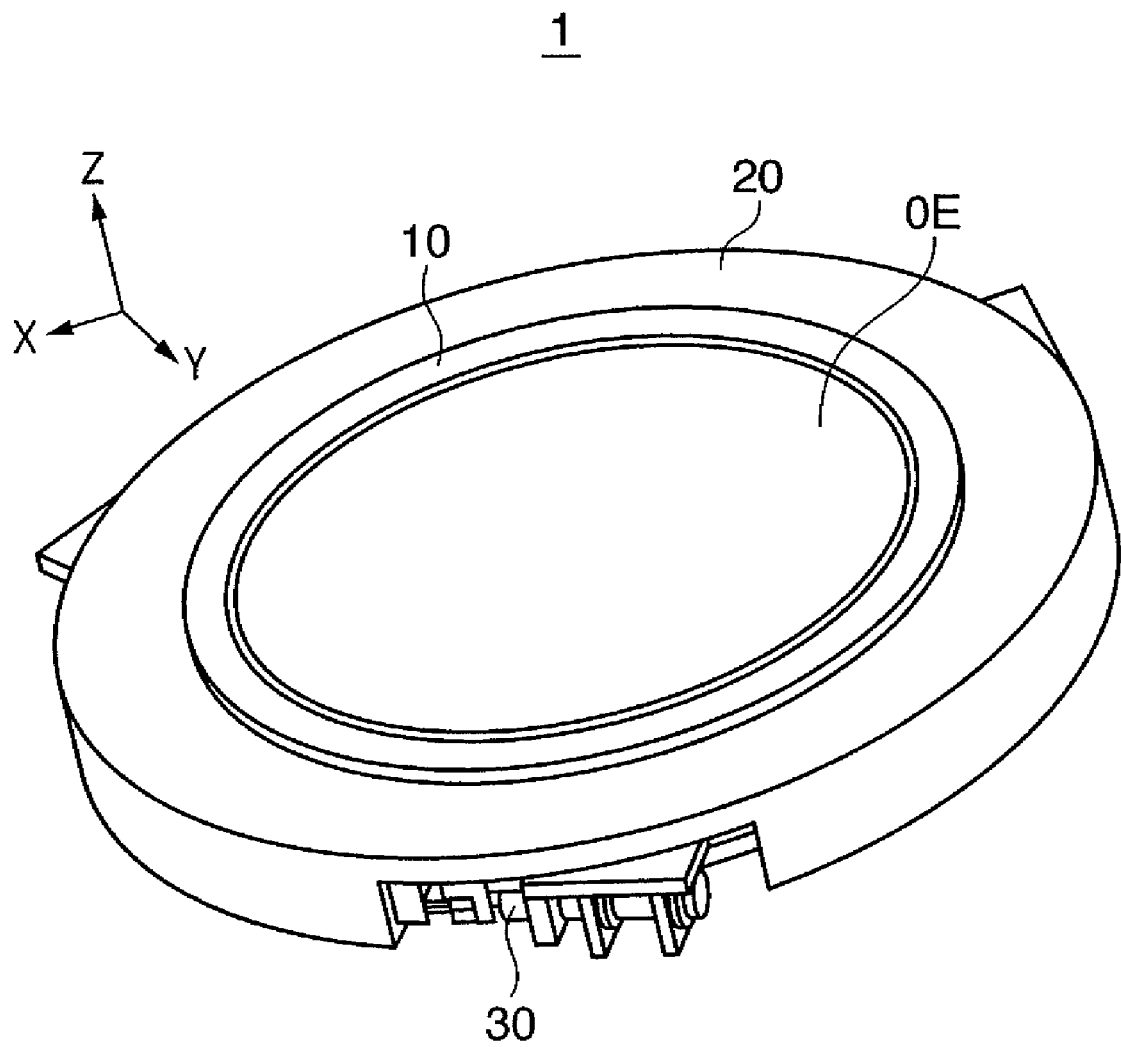
FIG. 1 is a schematic perspective view showing a holding apparatus according to one aspect of the present invention.

Preferred embodiments of the present invention will be described below with reference to the accompanying drawings. The same reference numerals denote the same members throughout the drawings, and a repetitive description thereof will not be given.

Figure 2:
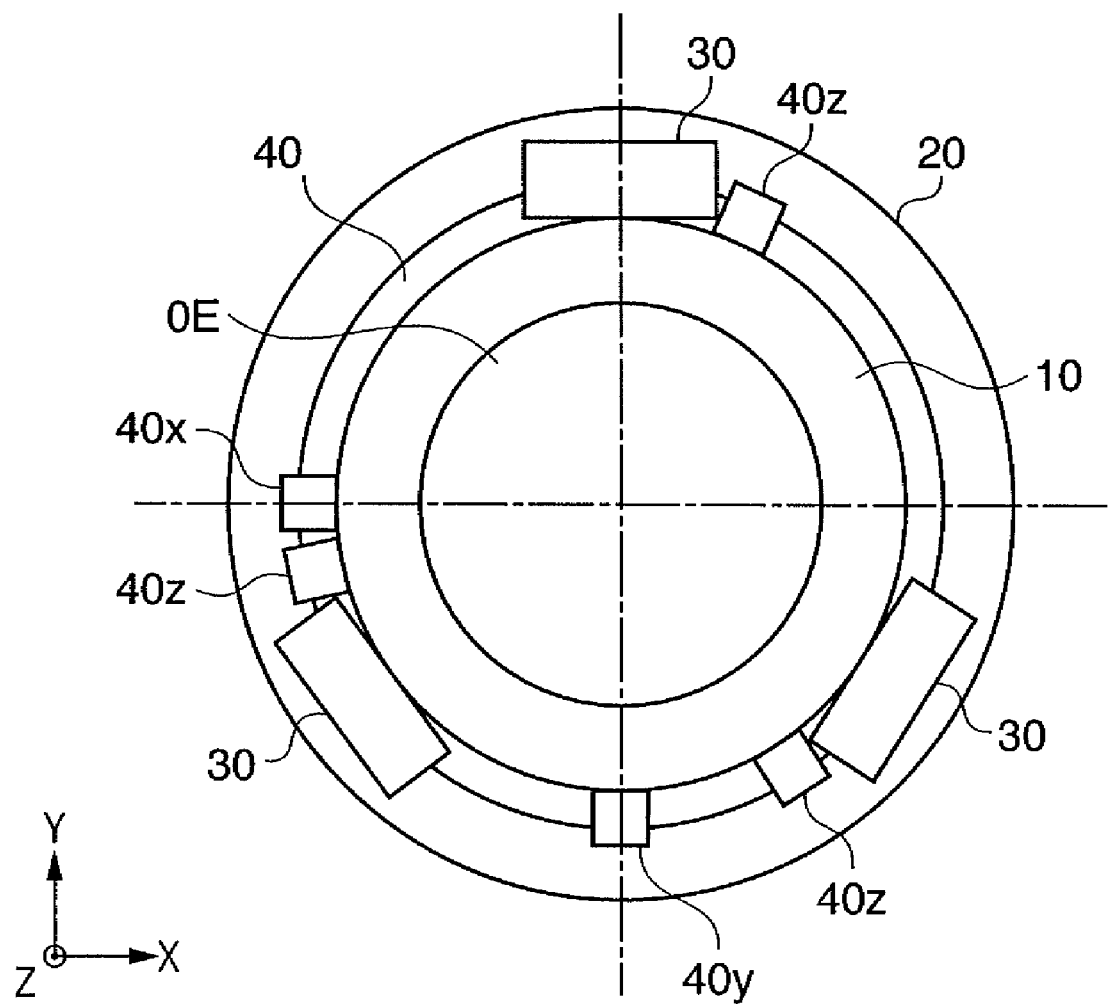
FIG. 2 is a schematic sectional view showing the holding apparatus shown in FIG. 1.

FIG. 1 is a schematic perspective view showing a holding apparatus 1 according to one aspect of the present invention. FIG. 2 is a schematic sectional view showing the holding apparatus 1. The holding apparatus 1 holds optical elements OE, such as a lens, a parallel-plate glass, a prism, a mirror, binary optics, and a hologram. In this embodiment, the holding apparatus 1 is embodied as a holding apparatus, which holds lenses of a projection optical system of an exposure apparatus. However, the holding apparatus 1 can also be adopted as a holding apparatus, which holds optical elements of an illumination optical system or optical elements of other optical systems of an exposure apparatus. The holding apparatus 1 is not particularly limited to an apparatus, which performs the positioning and position adjustment of optical elements of an exposure apparatus. The holding apparatus 1 is also applicable to an apparatus, such as an electron microscope stage, which requires high-accuracy positioning. As shown in FIGS. 1 and 2, the holding apparatus 1 includes a cell 10, holding unit 20, driving units 30, and displacement sensor 40.

The cell 10 is a ring-like member having the optical axis of the optical element OE as the center. For example, the cell 10 serves as a movable body (object), which bonds the optical element OE via an adhesive, and is driven by the driving units 30 (to be described later). In this embodiment, the cell 10 is mounted on the holding unit 20.

The holding unit 20 is a fixing block, which fixes the cell 10 bonded with the optical element OE to a lens barrel of the projection optical system. For example, the holding unit 20 mounts the cell 10 via three mounting units arranged on the circumference of the optical element OE, using the optical axis of the optical element OE as the center at a pitch of 120° (equidistantly). In other words, the holding unit 20 holds the optical element OE via the cell 10.

The driving units 30 connect the cell 10 and drive the optical element OE relative to the holding unit 20 in the vertical direction (Z direction), and the inclination directions ($\theta x$ direction and $\theta y$ direction). In other words, the driving units 30 serve as a driving apparatus that performs the positioning and position adjustment of the optical element OE in the projection optical system by driving the optical element OE. In this embodiment, the driving units 30 are arranged on the circumference of the optical element OE using the optical axis of the optical element OE as the center at a pitch of 120° (equidistantly). With this arrangement, the driving units 30 can attain driving in three axial directions, i.e., the Z direction, $\theta x$ direction, and $\theta y$ direction. As will be described in detail later, the driving units 30 can also limit the inclination (tilt) in the $\theta x$ direction and $\theta y$ direction, even while driving the optical element OE in the Z direction with a relatively long stroke.

The displacement sensor 40 measures displacements of the optical element OE. In this embodiment, as shown in FIG. 2, the displacement sensor 40 includes five sensors, i.e., three sensors 40z, which extend in the Z direction (a direction perpendicular to the paper surface of FIG. 2), one sensor 40x, which extends in the X direction, and one sensor 40y, which extends in the Y directions. The positioning and position adjustment of the optical element OE in the projection optical system can be controlled by feeding back the measurement results (i.e., the displacements of the optical element OE) obtained by the displacement sensor 40 to the driving units 30. Basically, only the three sensors 40z, which extend in the Z direction, can control the position of the optical element OE in three axial directions, i.e., the Z direction, $\theta x$ direction, and $\theta y$ direction.

Figure 3:
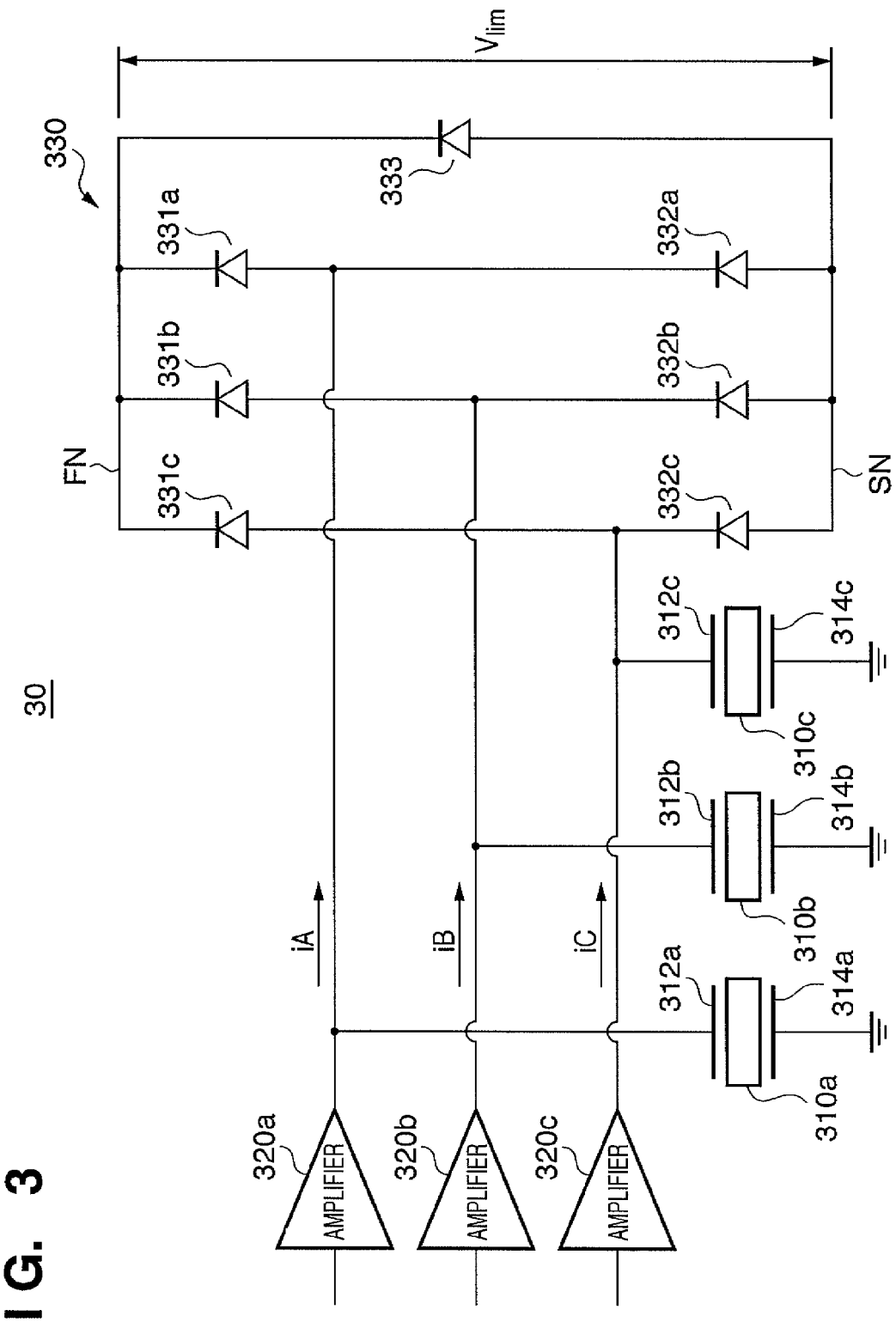
FIG. 3 is a schematic circuit diagram showing the arrangement of a driving unit according to the first embodiment, in the holding apparatus shown in FIG. 1.

The detailed arrangement of the driving unit 30 will be explained in detail below. FIG. 3 is a schematic circuit diagram showing the arrangement of a driving unit 30 according to the first embodiment. As shown in FIG. 3, the driving unit 30, according to the first embodiment, includes a plurality of piezoelectric elements 310a to 310c, a plurality of voltage applying units 320a to 320c, and control unit 330.

An example of each of the plurality of piezoelectric elements 310a to 310c is a piezoelectric element serving as a capacitive load. The plurality of piezoelectric elements 310a to 310c have first terminals 312a to 312c and second terminals 314a to 314c, and expand/contract depending on voltages applied across the first terminals 312a to 312c and the second terminals 314a to 314c. The plurality of piezoelectric elements 310a to 310c thus drive a plurality of portions of an optical element OE via the cell 10. The expansion/contraction amounts (i.e., the driving amounts of the optical element OE) of the plurality of piezoelectric elements 310a to 310c can be controlled by voltages applied to them.

The plurality of voltage applying units 320a to 320c apply voltages across the first terminals 312a to 312c and second terminals 314a to 314c of the plurality of piezoelectric elements 310a to 310c. The plurality of voltage applying units 320a to 320c include, for example, electrical current amplifiers.

The control unit 330 controls the plurality of voltage applying units 320a to 320c, so that the differences among voltages applied to the plurality of piezoelectric elements 310a to 310c do not exceed a predetermined value. In other words, the control unit 330 prevents the differences (potential differences) among a voltage applied to the piezoelectric element 310a, that applied to the piezoelectric element 310b, and that applied to the piezoelectric element 310c, from exceeding a predetermined value. This makes it possible to prevent a significant increase in the expansion/contraction amount (e.g., the driving amount of the optical element OE in the Z direction) of only a specific piezoelectric element, thus preventing the optical element OE from excessively tilting (in the $\theta z$ direction and $\theta y$ direction). In the first embodiment, the control unit 330 includes diodes 331a to 331c and 332a to 332c and Zener diode 333.

The diodes 331a to 331c and 332a to 332c determine the direction in which an electrical current flows. Between a first node FN and the first terminals 312a to 312c of the plurality of piezoelectric elements 310a to 310c, the diodes 331a to 331c constitute first diodes, in which the anodes are directed to the first terminals 312a to 312c. Between a second node SN and the first terminals 312a to 312c of the plurality of piezoelectric elements 310a to 310c, the diodes 332a to 332c constitute second diodes, in which the cathodes are directed to the first terminals 312a to 312c.

The Zener diode 333 determines a voltage value (predetermined value) $V_{lim}$ beyond which the differences (potential differences) among voltages applied to the plurality of piezoelectric elements 310a to 310c are limited. The voltage value $V_{lim}$ is the upper limit of the potential differences among the plurality of piezoelectric elements 310a to 310c. Based on a Zener voltage $V_{zd}$ of the Zener diode 333 and the ON voltages (about 0.6 V) of the diodes 331a to 331c and 332a to 332c, the voltage value $V_{lim}$ becomes about 1.2 V ($V_{lim} \approx V_{zd} + 1.2V$). The Zener diode 333 is connected between the first node FN and the second node SN, such that the anode of the Zener diode 333 is directed to the second terminals of the plurality of piezoelectric elements 310a to 310c.

The operation of the control unit 330 will be explained. For the sake of descriptive simplicity, attention will be focused on the piezoelectric elements 310a and 310b. Letting V1 be a voltage applied (generated) between the first terminal 312a and second terminal 314a of the piezoelectric element 310a, and V2 be a voltage applied (generated) between the first terminal 312b and second terminal 314b of the piezoelectric element 310b, V2>V1.

Referring to FIG. 3, when, for example, the potential difference (V2−V1) between the first terminal 312a of the piezoelectric element 310a and the first terminal 312b of the piezoelectric element 310b is about to exceed the voltage value $V_{lim}$, the Zener diode 333 is driven. An electrical current iB, flowing through a node connected to the first terminal 312b of the piezoelectric element 310b, flows, via the diodes 331b and 332a, into a node connected to the first terminal 312a of the piezoelectric element 310a with a relatively low voltage. As a consequence, the potential difference between the first terminal 312a of the piezoelectric element 310a and the first terminal 312b of the piezoelectric element 310b is suppressed below the voltage value $V_{lim}$. A series of these operations is readily applicable to even a case in which three or more piezoelectric elements are used. For example, if one piezoelectric element is additionally provided, additionally providing two diodes makes it possible to control the differences among voltages applied to a plurality of piezoelectric elements.

The control unit 330 in the driving unit 30, shown in FIG. 3, can easily control the differences among voltages applied to a plurality of piezoelectric elements. This makes it possible to prevent, e.g., only a specific piezoelectric element, which drives the optical element OE in the Z direction, from receiving a relatively high voltage (i.e., to prevent an increase in the driving amount of the optical element OE only in the Z direction), thus preventing the optical element OE from excessively tilting (in the θez direction and θy direction). In other words, it is possible to prevent any damage and deformation of the optical element OE, while limiting the driving amounts of the optical element OE in its inclination directions.

Since the driving unit 30, shown in FIG. 3, determines the voltage value $V_{lim}$ based on only the Zener voltage $V_{zd}$, it is possible to easily change the voltage value $V_{lim}$ by replacing the Zener diode 333. The use of the arrangement of the driving unit 30 provides the ability to attain a mechanism that easily limits the tilt of the optical element OE, at low cost.

FIG. 4 is a schematic circuit diagram showing the arrangement of a driving unit 30 according to the second embodiment. As shown in FIG. 4, the driving unit 30, according to the second embodiment, includes a plurality of piezoelectric elements 310a to 310c, a plurality of voltage applying units 320a to 320c, and control unit 330A.

The control unit 330A controls the plurality of voltage applying units 320a to 320c, so that the difference among voltages applied to the plurality of piezoelectric elements 310a to 310c does not exceed a predetermined value. Even though the control unit 330A has a function similar to that of the control unit 330, it has constituent elements different from those of the control unit 330. In the second embodiment, the control unit 330A includes diodes 331a to 331c and 332a to 332c, resistors 334a and 334b, transistor 335, Zener diode 336, transistor 337, and resistor 338.

The resistors 334a and 334b divide a voltage value (predetermined value) $V_{lim}$ beyond which the differences (potential differences) among voltage applied to the plurality of piezoelectric elements 310a to 310c are limited. In other words, the resistors 334a and 334b serve as a voltage dividing circuit, which divides the voltage between a first node FN and a second node SN.

The transistor (first transistor) 335 has a base applied with the voltage divided by the resistors 334a and 334b serving as a voltage dividing circuit, a collector connected to the first node side, and an emitter connected to the second node side.

The Zener diode 336 is connected between the second node SN and the emitter of the transistor 335, such that its cathode is directed to the emitter of the transistor 335.

The transistor (second transistor) 337 has a base applied with the voltage of the anode of the Zener diode 336, a collector connected to the first node side, and an emitter connected to the second node side.

The resistor 338 serves as an activating circuit which activates (i.e., which turns on) the transistor 337. The resistor 338 is connected between the second node SN and the anode of the Zener diode 336. However, it is also possible to substitute a MOSFET for the resistor 338.

Referring to FIG. 4, the resistors 334a and 334b, and Zener diode 336, determine the voltage value $V_{lim}$. The voltage value $V_{lim}$ is given by $(V_{zd}+2.4V) \times (R1+R2)/R2$, where $V_{zd}$ is the Zener voltage of the Zener diode 336, R1 is the resistance of the resistor 334a, and R2 is the resistance of the resistor 334b. Note that the ON voltages of the transistors 335 and 337 are 0.6 V.

The operation of the control unit 330A will be explained. For the sake of descriptive simplicity, attention will be focused on the piezoelectric elements 310a and 310b. Letting V1 be a voltage applied (generated) between a first terminal 312a and a second terminal 314a of the piezoelectric element 310a, and V2 be a voltage applied (generated) between a first terminal 312b and a second terminal 314b of the piezoelectric element 310b, V2>V1.

Consider, for example, a case in which the potential difference (V2−V1) between the first terminal 312a of the piezoelectric element 310a and the first terminal 312b of the piezoelectric element 310b is about to exceed the voltage value $V_{lim}$. In this case, when a voltage value $V_P$, obtained by dividing the voltage value $V_{lim}$ by the resistors 334a and 334b, is +1.2 V or more, the Zener diode 336 is driven. An electrical current flows through the collector-emitter path of the transistor 335. As the electrical current flows through the resistor 338, the transistor 337 is turned on. An electrical current iB, flowing through a node connected to the first terminal 312b of the piezoelectric element 310b, flows through the transistor 337 via the diode 331b and, then, flows into a node connected to the first terminal 312a of the piezoelectric element 310a with a relatively low voltage. As a consequence, the potential difference between the first terminal 312a of the piezoelectric element 310a and the first terminal 312b of the piezoelectric element 310b is suppressed below the voltage value $V_{lim}$. As in the first embodiment, a series of these operations is readily applicable to even a case in which three or more piezoelectric elements are used. For example, if one piezoelectric element is additionally provided, additionally providing two diodes makes it possible to control the differences among voltages applied to a plurality of piezoelectric elements.

The control unit 330A in the driving unit 30, shown in FIG. 4, can easily control the differences among voltages applied to the plurality of piezoelectric elements. This makes it possible to prevent, e.g., only a specific piezoelectric element, which drives an optical element OE in the Z direction, from receiving a relatively high voltage (i.e., to prevent an increase in the driving amount of the optical element OE only in the Z direction), thus preventing the optical element OE from excessively tilting (in the θz direction and θy direction). In other words, it is possible to prevent any damage and deformation of the optical element OE by driving the optical element OE, while limiting the driving amounts of the optical element OE in its inclination directions.

The driving unit 30, according to the second embodiment, has constituent elements, the number of which is larger than those of the driving unit 30, according to the first embodiment. However, using a transistor which produces a relatively large capacity loss as the transistor 337, the driving unit 30, according to the second embodiment, can generate an electrical current larger than that generated by the driving unit 30, according to the first embodiment. In other words, the arrangement of the driving unit 30, according to the second embodiment, is suitable for a case in which an amplifier, which can supply a relatively large electrical current to a node connected to a piezoelectric element, is used as each of the plurality of voltage applying units 320a to 320c.

The voltage value $V_{lim}$ can be easily adjusted by changing the resistances of the resistors 334a and 334b in the driving unit 30, shown in FIG. 4. The use of the arrangement of the driving unit 30 allows implementation of a mechanism that easily limits the tilt of the optical element OE, at low cost.

Figure 5:
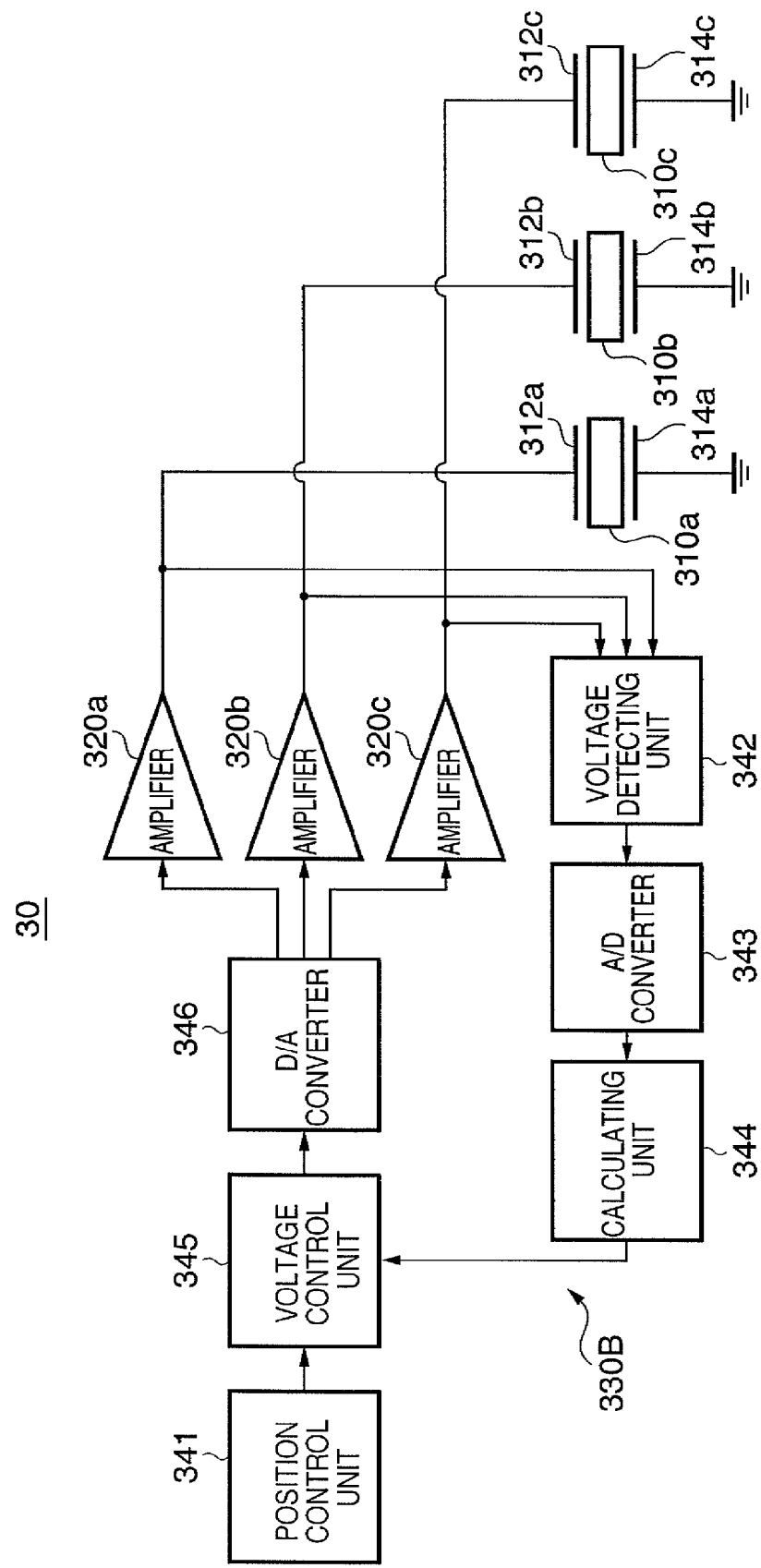
FIG. 5 is a schematic block diagram showing the arrangement of a driving unit according to the third embodiment, in the holding apparatus shown in FIG. 1.

FIG. 5 is a schematic block diagram showing the arrangement of a driving unit 30 according to the third embodiment. As shown in FIG. 5, the driving unit 30, according to the third embodiment, includes a plurality of piezoelectric elements 310a to 310c, a plurality of voltage applying units 320a to 320c, and control unit 330B.

The control unit 330B controls the plurality of voltage applying units 320a to 320c, so that the differences among voltages applied to the plurality of piezoelectric elements 310a to 310c do not exceed a predetermined value. The control unit 330B, according to the third embodiment, includes a position control unit 341, voltage detecting unit 3342, A/D converter 343, calculating unit 344, voltage control unit 345, and D/A converter 346.

The position control unit 341 has, e.g., a DSP and a CPU (i.e., an arithmetic processing function) for controlling the position of an optical element OE in the Z direction, θx direction, and θy direction with high accuracy. The position control unit 341 calculates the driving amounts (expansion/contraction amounts) of the piezoelectric elements 310a to 310c using, e.g., a PID compensator, based on the measurement result obtained by a sensor 40z, which measures a displacement of the optical element OE in the Z direction. The position control unit 341 generates input signals for applying voltages corresponding to the calculated driving amounts (expansion/contraction amounts) of the piezoelectric elements 310a to 310c to them, and outputs the generated input signals to the voltage control unit 345.

The voltage detecting unit 342 detects voltages (i.e., voltages output from the plurality of voltage applying units 320a to 320c) applied to the plurality of piezoelectric elements 310a to 310c.

The A/D converter 343 converts the voltages detected by the voltage detecting unit 342 into digital signals, and outputs them to the calculating unit 344.

Based on the digital signals (i.e., the detection results obtained by the voltage detecting unit 342) received from the A/D converter 343, the calculating unit 344 calculates the differences (potential differences) among voltages applied to the plurality of piezoelectric elements 310a to 310c, and outputs them to the voltage control unit 345.

Based on the potential differences calculated by the calculating unit 344, the voltage control unit 345 controls the voltages output from the plurality of voltage applying units 320a to 320c. In this embodiment, the voltage control unit 345 limits the input signals, which are received from the position control unit 341 and used to apply the voltages to the plurality of piezoelectric elements 310a to 310c. For example, the voltage control unit 345 compares a pre-stored potential difference with the potential differences calculated by the calculating unit 344, and controls the potential differences among the plurality of piezoelectric elements 310a to 310c detected by the voltage detecting unit 342 to be the pre-stored potential difference (so as not to exceed a predetermined value). More specifically, based on the potential differences received from the calculating unit 344, the voltage control unit 345 limits the input signals, which are received from the position control unit 341 and used to apply voltages to the plurality of piezoelectric elements 310a to 310c, so that the potential differences do not exceed a predetermined value. As a consequence, voltages (i.e., voltages output from the plurality of voltage applying units 320a to 320c) applied to the plurality of piezoelectric elements 310a to 310c by the plurality of voltage applying units 320a to 320c are limited.

The D/A converter 346 converts the input signals which are controlled (limited) by the voltage control unit 345 and used to apply voltages to the plurality of piezoelectric elements 310a to 310c into analog signals, and outputs them to the plurality of piezoelectric elements 310a to 310c.

The control unit 330B in the driving unit 30, shown in FIG. 5, can easily control the differences among voltages applied to the plurality of piezoelectric elements. This makes it possible to prevent, e.g., only a specific piezoelectric element, which drives the optical element OE in the Z direction, from receiving a relatively high voltage (i.e., to prevent an increase in the driving amount of the optical element OE in only in the Z direction), thus preventing the optical element OE from excessively tilting (in the θz direction and θy direction). In other words, it is possible to prevent any damage to and deformation of the optical element OE by driving the optical element OE, while limiting the driving amounts of the optical element OE in its inclination directions.

The driving unit 30, shown in FIG. 5, can control (especially, in the inclination directions) the position of the optical element OE independently of a control system, which controls the position of the optical element OE using a plurality of displacement sensors 40. Hence, the holding apparatus 1 can control the position of the optical element OE, even when, for example, any of the displacement sensors 40 fails.

As has been described above, the holding apparatus 1 can hold the optical element OE and can prevent any damage to and deformation of the optical element OE, by performing the positioning and position adjustment of the optical element OE (by driving the optical element OE), while limiting the driving amounts of the optical element OE in its inclination directions.

Figure 6:
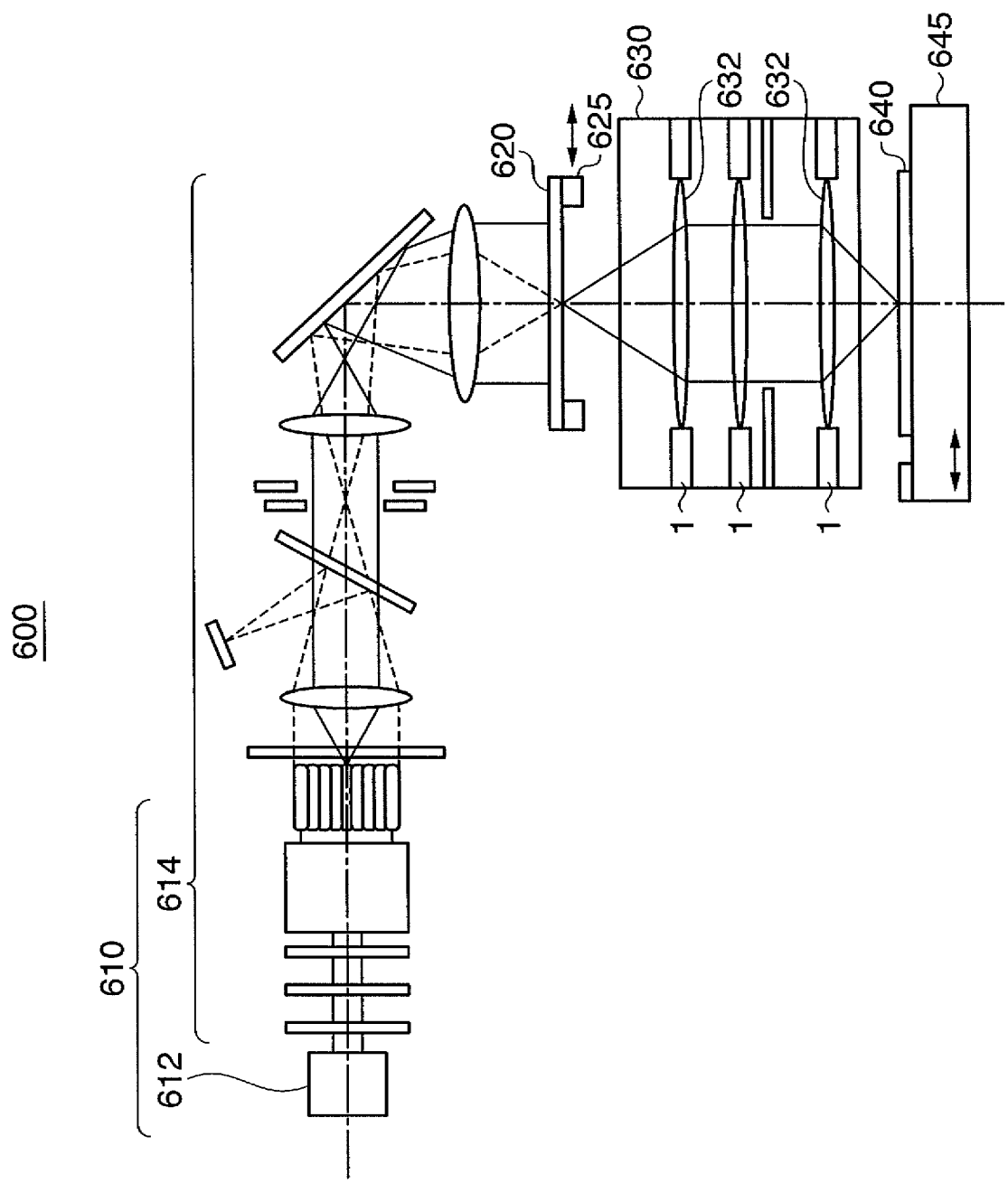
FIG. 6 is a schematic sectional view showing an exposure apparatus according to one aspect of the present invention.
Figure 7:
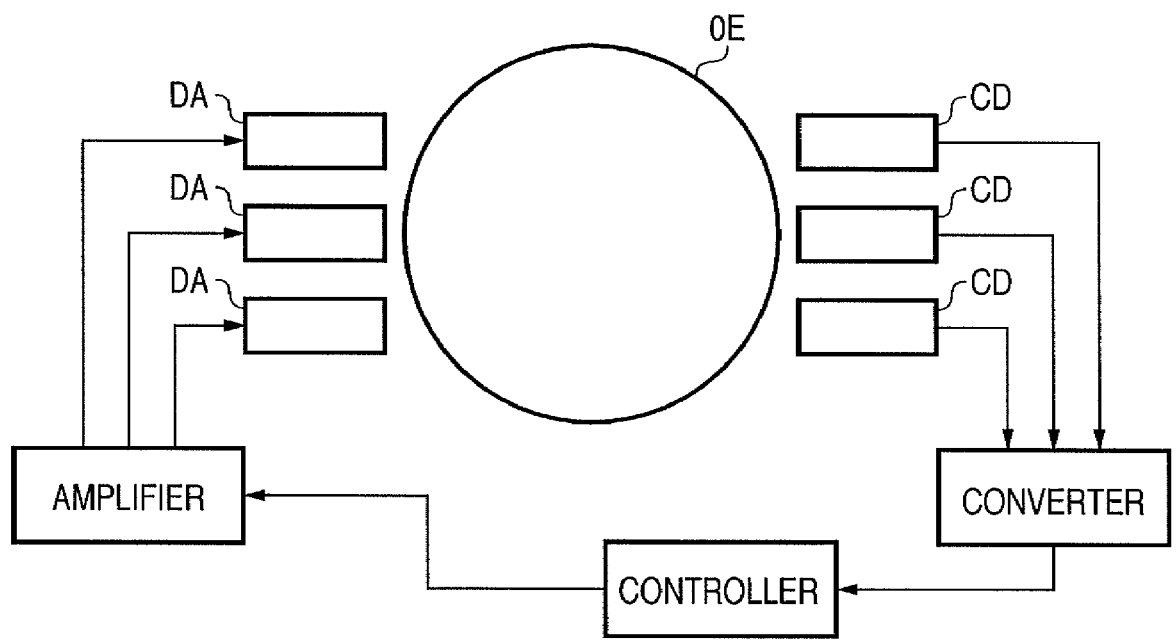
FIG. 7 is a block diagram schematically showing the positioning control of an optical element by a conventional driving mechanism.

An exposure apparatus 600 having a projection optical system 630, to which a holding apparatus 1 is applied, will be explained next, with reference to FIG. 6. FIG. 6 is a schematic sectional view of the exposure apparatus 600 according to one aspect of the present invention. In this embodiment, the exposure apparatus 600 is a projection exposure apparatus that transfers the pattern of a reticle 620 onto a wafer 640 by exposure using a step and scan scheme. However, the exposure apparatus 600 can adopt a step and repeat scheme.

As shown in FIG. 6, the exposure apparatus 600 includes an illumination apparatus 610, a reticle stage 625, which mounts the reticle 620, the projection optical system 630, and a wafer stage 645, which mounts the wafer 640.

The illumination apparatus 610 illuminates the reticle 620, on which a circuit pattern to be transferred is formed, and includes a light source unit 612 and an illumination optical system 614.

The light source unit 612 uses, e.g., an excimer laser, such as a KrF excimer laser with wavelength of about 248 nm, or an ArF excimer laser with a wavelength of about 193 nm, as a light source. However, the light source of the light source unit 612 is not particularly limited to an excimer laser, and may be, e.g., an $F_2$ laser with a wavelength of about 157 nm.

The illumination optical system 614 illuminates the reticle 620. The illumination optical system 614 includes, e.g., a lens, a mirror, an optical integrator, a phase plate, a diffractive optical element, and a stop. The holding apparatus 1 may be used to hold optical elements, such as lenses, of the illumination optical system 614.

The reticle 620 has a circuit pattern and is supported and driven by the reticle stage 625. Diffracted light generated by the reticle 620 is projected onto the wafer 640 via the projection optical system 630. Since the exposure apparatus 600 is of the step and scan scheme, it transfers the pattern of the reticle 620 onto the wafer 640 by scanning them.

The reticle stage 625 supports the reticle 620 and moves the reticle 620 in the X-axis direction, the Y-axis direction, the Z-axis direction, and the rotational directions about the respective axes using, e.g., linear motors. Note that the scanning direction of the reticle 620 or wafer 640 on its surface is defined as the Y-axis, a direction perpendicular to this direction on its surface is defined as the X-axis, and a direction perpendicular to the surface of the reticle 620 or wafer 640 is defined as the Z-axis.

The projection optical system 630 projects the pattern of the reticle 620 onto the wafer 640. The projection optical system 630 can be a dioptric system, a catadioptric system, or a catoptric system.

In this embodiment, the projection optical system 630 includes a plurality of lenses 632. The holding apparatus 1 holds the plurality of lenses 632. The plurality of lenses 632 in the projection optical system 630 undergo positioning and position adjustment free from any damage or deformation. Hence, the projection optical system 630 exhibits an excellent imaging performance. The holding apparatus 1 has the above-described arrangement, and a detailed description thereof will not be given herein.

The wafer 640 is a substrate onto which the pattern of the reticle 620 is projected (transferred). However, it is also possible to use a glass plate or other substrates in place of the wafer 640. The wafer 640 is coated with a resist.

The wafer stage 645 supports the wafer 640 and moves the wafer 640 in the X-axis direction, the Y-axis direction, the Z-axis direction, and the rotational directions about the respective axes using linear motors, such as the reticle stage 625.

In exposure, a light beam emitted by the light source unit 612 illuminates the reticle 620 via the illumination optical system 614. The light beam, which reflects the circuit pattern of the reticle 620 upon passing through the reticle 620, forms an image on the wafer 640 via the projection optical system 630. In the projection optical system 630 (and/or illumination optical system 614) used for the exposure apparatus 600, the holding apparatus 1 holds optical elements having undergone positioning and position adjustment. Hence, the exposure apparatus 600 exhibits an excellent exposure performance, so as to provide devices (e.g., a semiconductor device, an LCD device, an image sensing device (e.g., a CCD), and a thin-film magnetic head) with high throughput and high quality.

A description will be given of an embodiment of a device fabrication method using the above-mentioned exposure apparatus 600. The device is fabricated by a step of exposing a substrate coated with a resist (wafer or glass plate) using the exposure apparatus 600, a step of performing a development process for the substrate exposed, and a step of performing other well-known processes.

While the present invention has been described with reference to exemplary embodiments, it is to be understood that the invention is not limited to the disclosed exemplary embodiments. The scope of the following claims is to be accorded the broadest interpretation so as to encompass all such modifications, and equivalent structures and functions.

What is claimed is:

1. A driving apparatus which drives an object, said apparatus comprising:
   a plurality of piezoelectric elements configured to drive a plurality of portions of the object;
   a plurality of voltage applying units configured to apply voltages to said plurality of piezoelectric elements; and
   a control unit configured to control said plurality of voltage applying units so that differences among the voltages applied to said plurality of piezoelectric elements do not exceed a predetermined value.

2. The apparatus according to claim 1, wherein
   (i) each of said plurality of piezoelectric elements has a first terminal and a second terminal, and
   (ii) each of said plurality of voltage applying units applies a voltage between said first terminal and said second terminal of a corresponding one of said plurality of piezoelectric elements, and
   (iii) said control unit includes:
      (a) a plurality of first diodes, each of which is connected between a first node and said first terminal of a corresponding one of said plurality of piezoelectric elements, such that an anode thereof is directed to said first terminal,
      (b) a plurality of second diodes, each of which is connected between a second node and said first terminal of a corresponding one of said plurality of piezoelectric elements, such that a cathode thereof is directed to said first terminal, and
      (c) a Zener diode connected between the first node and the second node, such that an anode thereof is directed to the second node.

3. The apparatus according to claim 1, wherein
   (i) each of said plurality of piezoelectric elements has a first terminal and a second terminal, (ii) each of said plurality of voltage applying units applies a voltage between said first terminal and said second terminal of a corresponding one of said plurality of piezoelectric elements, and
(iii) said control unit includes:
  (a) a plurality of first diodes, each of which is connected between a first node and said first terminal of a corresponding one of said plurality of piezoelectric elements, such that an anode thereof is directed to said first terminal,
  (b) a plurality of second diodes, each of which is connected between a second node and said first terminal of a corresponding one of said plurality of piezoelectric elements such that a cathode thereof is directed to said first terminal,
  (c) a voltage dividing circuit configured to divide a voltage between the first node and the second node,
  (d) a first transistor which is configured to have a base applied with the voltage divided by said voltage dividing circuit, a collector connected to a side of the first node, and an emitter connected to a side of the second node,
  (e) a Zener diode connected between the second node and said emitter of said first transistor such that a cathode thereof is directed to said emitter of said first transistor,
  (f) a second transistor which is configured to have a base applied with a voltage of an anode of said Zener diode, a collector connected to a side of the first node, and an emitter connected to a side of the second node, and
  (g) an activating circuit which is connected between the second node and the anode of said Zener diode, and is configured to activate said second transistor.

4. The apparatus according to claim 1, wherein
(i) each of said plurality of piezoelectric elements has a first terminal and a second terminal,
(ii) each of said plurality of voltage applying units applies a voltage between said first terminal and said second terminal of a corresponding one of said plurality of piezoelectric elements, and
(iii) said control unit includes:
  (a) a voltage detecting unit configured to detect the voltages applied to said plurality of piezoelectric elements,
  (b) a calculating unit configured to calculate differences among the voltages which are detected by said voltage detecting unit and applied to said plurality of piezoelectric elements, and
  (c) a voltage control unit configured to control the voltages output from said plurality of voltage applying units, based on the differences among the voltages applied to said plurality of piezoelectric elements, which are calculated by said calculating unit.

5. A holding apparatus comprising:
(a) a holding unit configured to hold an optical element; and
(b) a driving apparatus configured to drive the optical element held by said holding unit, wherein said driving apparatus includes:
  (i) a plurality of piezoelectric elements configured to drive a plurality of portions of the optical element,
  (ii) a plurality of voltage applying units configured to apply voltages to said plurality of piezoelectric elements, and
  (iii) a control unit configured to control said plurality of voltage applying units so that differences among the voltages applied to said plurality of piezoelectric elements do not exceed a predetermined value.

6. An exposure apparatus comprising:
a holding apparatus according to claim 5; and
an optical system configured to transfer a pattern of a reticle onto a substrate by exposure via an optical element held by said holding apparatus.

7. A device fabrication method comprising steps of:
exposing a substrate using an exposure apparatus according to claim 6; and
performing a development process for the substrate exposed.

* * * * *